(12) United States Patent
Löffler et al.

(10) Patent No.: US 9,202,978 B2
(45) Date of Patent: Dec. 1, 2015

(54) RADIATION-EMITTING SEMICONDUCTOR CHIP HAVING INTEGRATED ESD PROTECTION

(75) Inventors: Andreas Löffler, Regensburg (DE);
Christian Leirer, Regensburg (DE);
Rainer Butendeich, Regensburg (DE);
Tobias Meyer, Ihrlerstein (DE);
Matthias Peter, Regensburg (DE)

(73) Assignee: OSRAM Opto Semiconductors GmbH (DE)

( * ) Notice: Subject to any disclaimer, the term of this patent is extended or adjusted under 35 U.S.C. 154(b) by 70 days.

(21) Appl. No.: 14/114,044

(22) PCT Filed: Apr. 26, 2012

(86) PCT No.: PCT/EP2012/057676
§ 371 (c)(1),
(2), (4) Date: Jan. 8, 2014

(87) PCT Pub. No.: WO2012/146668
PCT Pub. Date: Nov. 1, 2012

(65) Prior Publication Data
US 2014/0183594 A1      Jul. 3, 2014

(30) Foreign Application Priority Data

Apr. 29, 2011    (DE) .......................... 10 2011 100 037

(51) Int. Cl.
*H01L 29/24*    (2006.01)
*H01L 33/26*    (2010.01)
(Continued)

(52) U.S. Cl.
CPC .............. *H01L 33/26* (2013.01); *H01L 33/025* (2013.01); *H01L 33/14* (2013.01); *H01L 33/24* (2013.01); *H01L 33/32* (2013.01)

(58) Field of Classification Search
CPC ....... H01L 33/025; H01L 33/14; H01L 33/26; H01L 33/24; H01L 33/32; H01L 27/14643; H01L 27/14609; H01L 29/2003; H01L 31/184; H01L 31/1852; H01L 33/007; H01L 29/475; H01L 29/66136; H01L 29/8611
USPC .................................. 257/13–15, 94–97, 103
See application file for complete search history.

(56) References Cited

U.S. PATENT DOCUMENTS

| 6,172,382 B1* | 1/2001 | Nagahama et al. ............. 257/94 |
| 2006/0246612 A1* | 11/2006 | Emerson et al. ................ 438/22 |

(Continued)

FOREIGN PATENT DOCUMENTS

| CN | 101359710 | 2/2009 |
| CN | 101847673 | 9/2010 |

(Continued)

OTHER PUBLICATIONS

English translation of Japanese Notice of Reasons for Rejection dispatched Oct. 14, 2014 from corresponding Japanese Patent Application No. 2014-506870.

(Continued)

*Primary Examiner* — Thanh T Nguyen
(74) *Attorney, Agent, or Firm* — DLA Piper LLP (US)

(57) ABSTRACT

A radiation-emitting semiconductor chip having a semiconductor layer sequence based on a nitride compound semiconductor material and having a pn junction includes a first protective layer having deliberately introduced crystal defects, a second protective layer having a higher doping than the first protective layer, wherein the first protective layer protects the semiconductor chip against electrostatic discharge pulses, an active zone that generates radiation disposed downstream of the first protective layer in a growth direction, wherein during operation of the semiconductor chip, a breakdown behavior of the semiconductor layer sequence in a reverse direction in regions having crystal defects differs from regions without crystal defects, and wherein in the event of electrostatic discharge pulses, electrical charge is dissipated in a homogeneously distributed manner via the regions having crystal defects.

20 Claims, 3 Drawing Sheets

(51) Int. Cl.
*H01L 33/02* (2010.01)
*H01L 33/14* (2010.01)
*H01L 33/24* (2010.01)
*H01L 33/32* (2010.01)

(56) References Cited

U.S. PATENT DOCUMENTS

2006/0246614 A1   11/2006   Suh
2009/0014713 A1*  1/2009    Kang et al. .................. 257/13
2010/0155704 A1   6/2010    Oh et al.
2012/0298964 A1   11/2012   Peter et al.

FOREIGN PATENT DOCUMENTS

JP    2007-180495        7/2007
JP    2010-232485        10/2010
WO    2011/080219 A1     7/2011

OTHER PUBLICATIONS

English translation of Taiwanese Notification for the Opinion of Examination dated Aug. 14, 2014 from corresponding Taiwanese Patent Application No. 101115037.
Hirokazu Takahashi et al., "Effect of Intentionally Formed 'V-Defects' on the Emission Efficiency of GaInN Single Quantum Well," Japanese Journal of Applied Physics, vol. 39, Part 2, No. 6B, Jun. 15, 2000, pp. L569-L571 (Abstract only).
A. Hangleiter et al., : Suppression of Nonradiative Recombination by V-Shaped Pits in GaInN/GaN Quantum Wells Produces a Large Increase in the Light Emission Efficiency, The American Physical Society, Physical Review Letters, 95, Sep. 14, 2005, pp. 127402-1-127402-4 (Abstract only).
Chi-Ling Lee et al., "Using Planarized p-GaN Layer to Reduce Electrostatic Discharged Damage in Nitride-Based Light-Emitting Diode," Japanese Journal of Applied Physics, vol. 46, No. 19, May 1, 2001, pp. L457-L460 (Abstract only).

* cited by examiner

RADIATION-EMITTING SEMICONDUCTOR CHIP HAVING INTEGRATED ESD PROTECTION

TECHNICAL FIELD

This disclosure relates to a radiation-emitting semiconductor chip having integrated ESD ("electrostatic discharge") protection.

BACKGROUND

A radiation-emitting semiconductor chip of the type mentioned is described, for example, in PCT/EP2010/070658, the contents of which are incorporated herein by reference. There is nonetheless a need to provide a radiation-emitting semiconductor chip which is particularly stable in relation to electrostatic discharge pulses, so-called "ESD voltage pulses," without this being accompanied by an appreciable loss of radiation.

SUMMARY

A radiation-emitting semiconductor chip has a semiconductor layer sequence based on a nitride compound semiconductor material and has a pn junction including a first protective layer having deliberately introduced crystal defects, a second protective layer having a higher doping than the first protective layer, wherein the first protective layer protects the semiconductor chip against electrostatic discharge pulses, an active zone that generates radiation disposed downstream of the first protective layer in a growth direction, wherein during operation of the semiconductor chip, a breakdown behavior of the semiconductor layer sequence in a reverse direction in regions having crystal defects differs from regions without crystal defects, and wherein in the event of electrostatic discharge pulses, electrical charge is dissipated in a homogeneously distributed manner via the regions having crystal defects.

A radiation-emitting semiconductor chip has a semiconductor layer sequence based on a nitride compound semiconductor material and has a pn junction including a first protective layer having deliberately introduced crystal defects, a second protective layer having a higher doping than the first protective layer, wherein the first protective layer protects the semiconductor chip against electrostatic discharge pulses, an active zone that generates radiation disposed downstream of the first protective layer in the growth direction, wherein during operation of the semiconductor chip, an electrical resistance of the semiconductor layer sequence in a reverse direction in regions having crystal defects is reduced compared to regions without crystal defects, and the second semiconductor layer homogenizes current flow due to its higher doping so that in the event of electrostatic discharge pulses electrical charge is dissipated in a homogeneously distributed manner via the regions having crystal defects.

DETAILED DESCRIPTION

Figure 1:
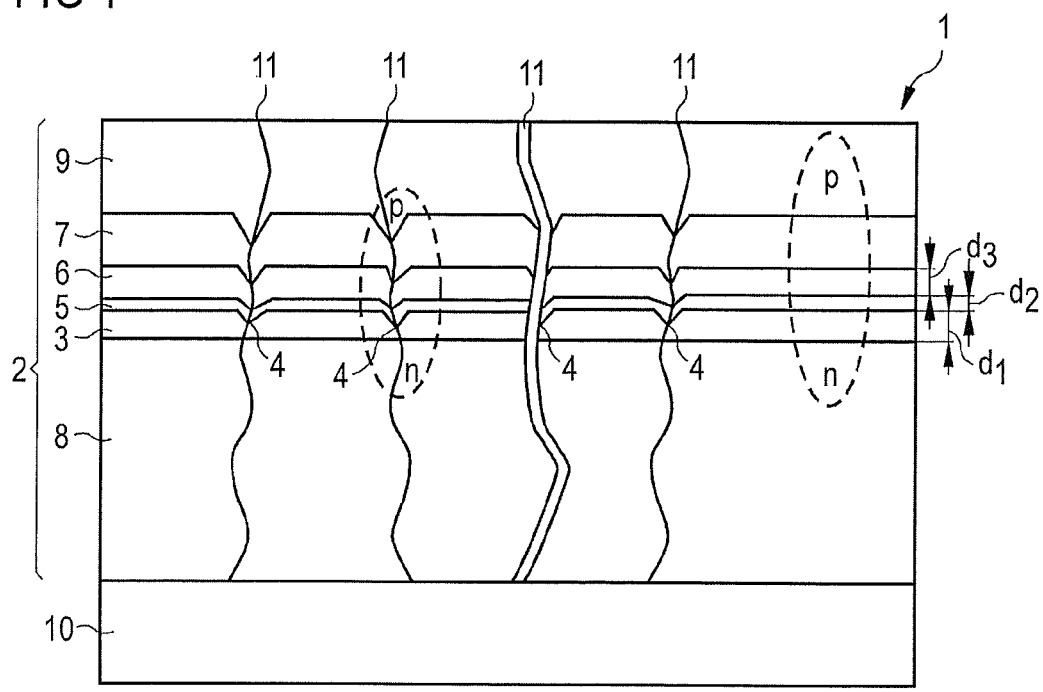
FIG. 1 shows a schematic sectional view of a radiation-emitting semiconductor chip.

Our radiation-emitting semiconductor chips may be a light-emitting diode chip that emits green and/or blue light during operation.

The radiation-emitting semiconductor chip may comprise a semiconductor layer sequence based on a nitride compound semiconductor material. In this case, a semiconductor layer sequence should be understood to mean a succession of semiconductor layers. A semiconductor layer is characterized, in particular, in that the material composition within the layer does not change or hardly changes and/or in that the region formed by the layer performs a specific function in the semiconductor chip. In this case, a semiconductor layer can comprise a multiplicity of monolayers of a semiconductor material.

Furthermore, "based on nitride compound semiconductor material" means that the semiconductor layer sequence or at least one layer thereof comprises a nitride III/V compound semiconductor material, preferably $Al_nGa_mIn_{1-n-m}N$, where $0 \leq n \leq 1$, $0 \leq m \leq 1$ and $n+m \leq 1$. In this case, this material need not necessarily have a mathematically exact composition according to the above formula. Rather, it can comprise one or more dopants and additional constituents which substantially do not change the characteristic physical properties of the $Al_nGa_mIn_{1-n-m}N$ material. For the sake of simplicity, however, the above formula includes only the essential constituents of the crystal lattice (Al, Ga, In, N), even if these can be replaced in part by small amounts of further substances.

The semiconductor layer sequence of the radiation-emitting semiconductor chip may have a pn junction. The pn junction is situated between a p-conducting region and an n-conducting region of the semiconductor layer sequence. The active zone that generates radiation is arranged between the p-conducting region and the n-conducting region and comprises the pn junction. The active zone is in particular as a multiple quantum well (MQW) structure.

The semiconductor layer sequence may comprise a first protective layer, which has deliberately introduced crystal defects. In this case, "deliberately introduced" means that, during production of the first protective layer, growth parameters, in particular a growth temperature, are set such that crystal defects arise.

In particular, the crystal defects are so-called "V-defects." A V-defect has in the nitride compound semiconductor material, for example, the form of an open pyramid which is inverted in the growth direction and which has a hexagonal base surface, for example. In cross section, this defect has the form of a V. V-defects form, for example, in the region of threading dislocations which arise, for example, during the heteroepitaxy of the semiconductor material onto a growth substrate having a different lattice constant than the semiconductor material. By way of example, the nitride compound semiconductor material may be grown onto a growth substrate composed of sapphire with respect to which the nitride compound semiconductor material has a lattice mismatch of approximately 14%. However, threading dislocations are also observed during homoepitaxy such that the semiconductor layer sequence can, for example, also be deposited onto a growth substrate based on GaN or consists of GaN.

A large portion of the crystal defects may have similar dimensions. That is to say that at least 50%, in particular at least 75%, or in the extreme case 100%, of the crystal defects have similar dimensions. In this case, the crystal defects have similar dimensions if, for example, the base surface of the crystal defects in a plane perpendicular to the growth direction fluctuates at most by ±25%, in particular at most by ±10%, around an average value of the base surface of the crystal defects in the plane. That is to say that a large portion of the crystal defects were then distinguished by an identical or similar base surface. In the region of the crystal defects having similar dimensions, the semiconductor layer sequence has a breakdown behavior of identical type, which preferably becomes apparent in electrical properties of identical type. In particular, an electrical resistance in the reverse direction is approximately of identical magnitude in these regions.

In the region of the crystal defects, the pn junction of the semiconductor layer sequence leads to so-called "microdiodes" which have a current-voltage characteristic curve typical of a semiconductor diode. During operation of the radiation-emitting semiconductor chip, preferably no radiative recombination of charge carriers takes place in the region of the crystal defects. That is to say that the microdiodes are not provided to generate electromagnetic radiation, at least not to generate electromagnetic radiation in the visible range.

Preferably, during operation of the semiconductor chip, a breakdown behavior of the semiconductor layer sequence in the reverse direction in regions having crystal defects differs from regions without crystal defects, wherein in the event of electrostatic discharge pulses electrical charge is dissipated in a homogeneously distributed manner via the regions having crystal defects. By the homogeneous charge distribution, critical current densities in the semiconductor chip that would lead to damage to the radiation-emitting semiconductor chip may be prevented.

Furthermore, during operation of the semiconductor chip, preferably the electrical resistance of the semiconductor layer sequence in the reverse direction in regions having crystal defects is reduced compared to regions without crystal defects. Advantageously, the semiconductor layer sequence has a lower breakdown voltage in the reverse direction in the regions having crystal defects than in the regions without crystal defects.

Furthermore, the pn junction of the semiconductor layer sequence preferably has a higher threshold voltage in the forward direction in the regions having crystal defects than in regions without crystal defects. As a result, radiative recombination takes place during operation in particular in the regions of the active zone which have no crystal defects. Furthermore, the charge in the event of an ESD pulse is preferably not dissipated by the regions of the active zone that generate radiation, but rather by the regions in which preferably no radiative recombination takes place.

What is problematic, however, is that the morphology of the semiconductor material is impaired by the crystal defects of the first protective layer, which can be accompanied by a loss of radiation.

The semiconductor layer sequence may comprise a second protective layer having a higher doping than the first protective layer. In particular, the average doping of the second protective layer is higher than the average doping of the first protective layer. The second protective layer advantageously has an average doping of $2*10^{18}/cm^3$ to $2*10^{19}/cm^3$. A preferred average doping for the second protective layer is $6*10^{18}/cm^3$. Particularly preferably, the second protective layer is n-doped, wherein appropriate dopants include silicon or germanium, for example.

In particular, the first and second protective layers protect the semiconductor chip against electrostatic discharge pulses. Advantageously, by the second protective layer, which contributes to homogenization of the current flow on account of its higher doping, the first protective layer can be made comparatively thin, as a result of which morphological disturbances can be reduced while at the same time maintaining the ESD stability. By the improved crystal quality, the brightness can be increased compared to the previous semiconductor chip.

The semiconductor layer sequence may comprise a further protective layer. The further protective layer can be arranged between the first protective layer and the active region. The further protective layer preferably has a lower doping than the first protective layer. Preferably, the magnitude of the doping of the further protective layer is at most half that of the doping of the first protective layer. Particularly preferably, the further protective layer is nominally undoped. Nominally undoped means that, during production, no dopants are deliberately introduced into the material of the further protective layer. It has been found that stability in relation to electrostatic discharge can be further increased by such a further protective layer without the thickness of the semiconductor material disposed upstream of the active zone in the growth direction overall having to be significantly increased. The risk of a reduced optical output power on account of an increased layer thickness can thus be avoided or at least reduced.

Preferably, thickness of the further protective layer is 2 nm to 15 nm, particularly preferably 4 nm to 7 nm, for example, 5 nm.

Further preferably, the further protective layer contains $In_xGa_{1-x}N$. The indium content x is preferably less than the indium content of the quantum layers of the active zone. The indium content is furthermore preferably greater than the indium content of the first protective layer.

By virtue of the first and second protective layers, the radiation-emitting semiconductor chip has an ESD strength of at least 1 kV. By way of example, an ESD strength of at least 1 kV, typically of approximately 2 kV, is achieved. The ESD strength can be increased further by the further protective layer.

Advantageously, the first protective layer has a thickness of 20 nm to 100 nm. In particular, the thickness is 20 nm to 80 nm.

Furthermore, the second protective layer preferably has a thickness of 2 nm to 50 nm, preferably 2 nm to 30 nm, particularly preferably 2 nm to 15 nm. In particular, the second protective layer is 5 nm thick.

The thinner the first protective layer is made, the smaller the diameter of the crystal defects becomes. The density of the crystal defects remains unchanged, however. Preferably, the density of the crystal defects is at least $5*10^7/cm^2$. By way of example, the density of the crystal defects is at least $10^8/cm^2$. This can be achieved, for example, by a corresponding growth parameter with which the first protective layer is grown in which the crystal defects are arranged. In this case, the specified density relates, in particular, to the case of epitaxy onto a sapphire, SiC or GaN substrate.

The active zone is disposed downstream of the first protective layer and the second protective layer in the growth direction. That is to say that, during production of the semiconductor layer sequence, first the first and second protective layers and subsequently the active zone are grown.

Advantageously, the second protective layer is arranged at a distance of greater than zero from the active zone. That is to say that the second protective layer and the active zone do not directly adjoin one another. In particular, the second protective layer is arranged at a distance of at least 20 nm and at most 100 nm, preferably of 60 nm, from the active zone.

Preferably, the second protective layer is arranged between the first protective layer and the active zone. In particular, the second protective layer is arranged directly on the first protective layer.

Preferably, the semiconductor layer sequence has an injection layer. In particular, the injection layer improves the injection of electrons into the active zone. The injection layer is advantageously arranged between the second protective layer and the active zone. The thickness of the injection layer preferably assumes values of 20 nm to 100 nm. The injection layer can have a superlattice structure, that is to say alternately arranged layers having different material compositions. By way of example, the injection layer can have alternately arranged InGaN layers and GaN layers. Furthermore, the GaN layers can be n-doped, when silicon, for example, is appropriate as dopant. In this case, the InGaN layers can be n-doped or undoped.

The further protective layer is preferably arranged between the injection layer and the active zone. The further protective layer is furthermore preferably spaced apart from a quantum layer of the active zone situated closest to the further protective layer. In particular, a separating layer can be formed between the further protective layer and the quantum layer situated closest. Preferably, the separating layer is more heavily doped than the further protective layer. The further protective layer therefore adjoins on both sides material more heavily doped than the further protective layer. Preferably, the adjoining material is doped at least twice as heavily.

Alternatively, the further protective layer can be arranged on that side of the first protective layer facing away from the active region.

Advantageously, the second protective layer has a higher doping than the injection layer. In particular, the average doping of the second protective layer is higher than the average doping of the injection layer. By way of example, the average doping in the injection layer can assume values of 0 to $4*10^{18}/cm^3$, in particular the value $5*10^{17}/cm^3$.

Furthermore, the average doping of the first protective layer can assume values of 0 to $4*10^{18}/cm^3$, in particular the value $1.5*10^{18}/cm^3$.

Preferably, a material composition and/or the doping of at least one of three layers comprising the first protective layer, the second protective layer and the injection layer change(s) within the respective layer.

By way of example, the first protective layer can have a material composition that remains constant and can be formed in particular from GaN. However, it is also possible for the material composition in the first protective layer to change. By way of example, the first protective layer can have at least two partial layers of which, for example, one is formed from GaN and the other is formed from InGaN.

In particular, the first protective layer is n-doped. The doping can be constant within the first protective layer. However, it is also possible for the doping to change within the first protective layer. Preferably, the first protective layer has at least two partial layers of which the partial layer facing the second protective layer has a lower doping than the partial layer facing away from the second protective layer.

Correspondingly, the second protective layer can also have at least two partial layers having a different material composition and/or doping.

We also provide a method of producing a radiation-emitting semiconductor chip of the type mentioned above. That is to say that the features described for the method are also disclosed for the semiconductor chip, and vice versa.

The method comprises, for example, the following steps.

First, a growth substrate is provided.

In a subsequent method step, a first protective layer, a second protective layer and an active zone disposed downstream of the first and second protective layers can be deposited epitaxially. The first protective layer is deposited at a growth temperature at which crystal defects arise with high density.

Usually one attempts to avoid the occurrence of the crystal defects during epitaxy. In this case, however, to produce the microdiodes, the first protective layer is grown at low growth temperatures to produce crystal defects, in particular V-defects, with sufficient density. In this case, the actual temperature range suitable to produce the crystal defects depends on the growth installation used. It can be determined by growing a first protective layer at different temperatures and selecting a temperature range for which the density of the crystal defects is sufficient or particularly high.

In this case, a temperature range of less than 920° C., in particular of at least 790° C. and at most 870° C., is chosen with which the first protective layer is deposited. This temperature range has proved to be suitable to form crystal defects in the region of which the microdiodes are formed, via which charge can be dissipated in the event of an ESD pulse.

The first protective layer is grown in particular at a growth temperature of at most 920° C., in particular using a triethylgallium precursor with the carrier gas nitrogen ($N_2$). This growth mode has proved to be particularly advantageous to produce crystal defects, in particular V-defects, having similar dimensions and thus producing microdiodes having a breakdown behavior of identical type, in particular having electrical properties of identical type. In contrast to customary growth conditions for n-doped GaN layers, for example, with which the layers are grown using a trimethylgallium precursor with the carrier gas hydrogen ($H_2$), geometrically very similar crystal defects arise with high density under these growth conditions. In other words, the growth is restricted in a lateral direction, transversely with respect to the growth direction. In this way, crystal defects arise in particular at dislocation lines in a clearly defined layer.

The material of the growth substrate may have a lattice mismatch with respect to the material of the semiconductor layer sequence to be grown. By way of example, sapphire, SiC or GaN is chosen as a growth substrate, and the subsequent semiconductor layer sequence is based on a nitride compound semiconductor material. In this case, crystal defects, in particular V-defects, arise with particularly high density.

The second protective layer is grown in particular onto the first protective layer and has a higher average doping and is thinner compared to the first protective layer.

It goes without saying that the method described is also suitable to produce a radiation-emitting semiconductor chip in which a further protective layer is provided as an alternative to the second protective layer or in addition to the second protective layer. The method is particularly suitable to produce the semiconductor chip described above. Features described in connection with the semiconductor chip can therefore also be used for the method, and vice versa.

The radiation-emitting semiconductor chip described here is explained in greater detail below on the basis of examples and the associated figures.

With reference to FIG. 1, an example of a radiation-emitting semiconductor chip of the type mentioned above is shown.

Figure 2:
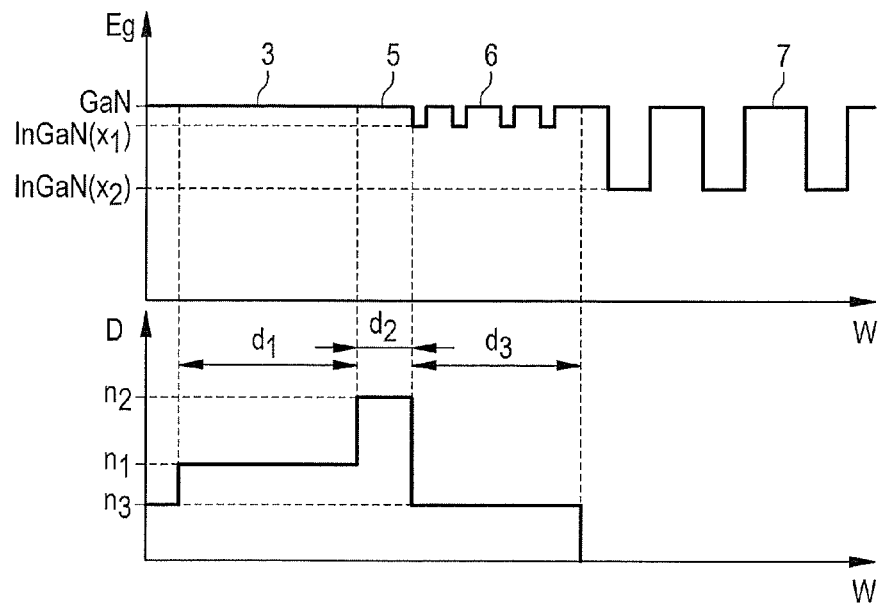
FIG. 2 shows graphs of the material composition and doping for an example of a semiconductor layer sequence.
Figure 3:
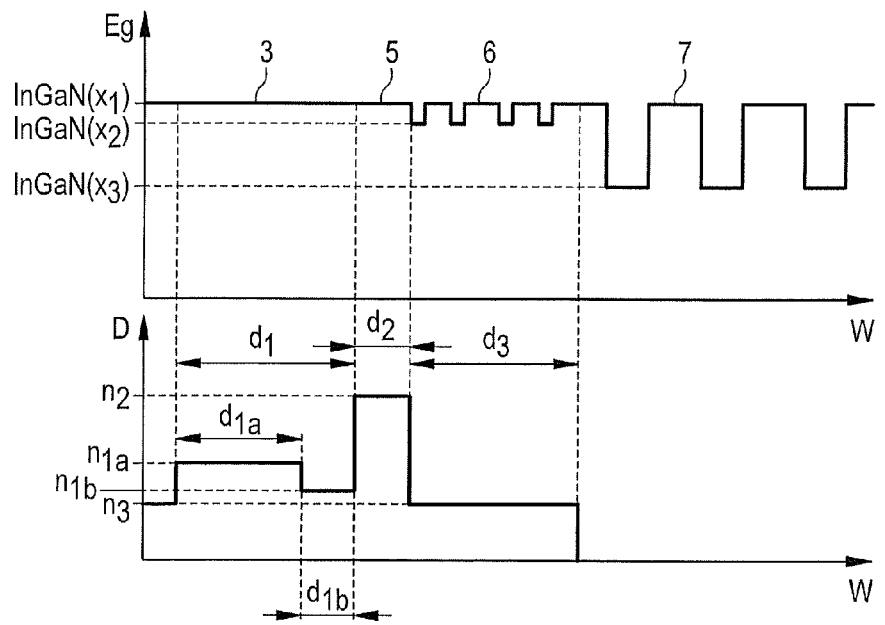
FIG. 3 shows graphs of the material composition and doping for an example of a semiconductor layer sequence.

With reference to the diagrams in FIGS. 2 and 3, two different variants for the material composition and doping of the first and second protective layers and of the injection layer and of the active zone of a radiation-emitting semiconductor chip of the type mentioned above are shown.

Figure 4:
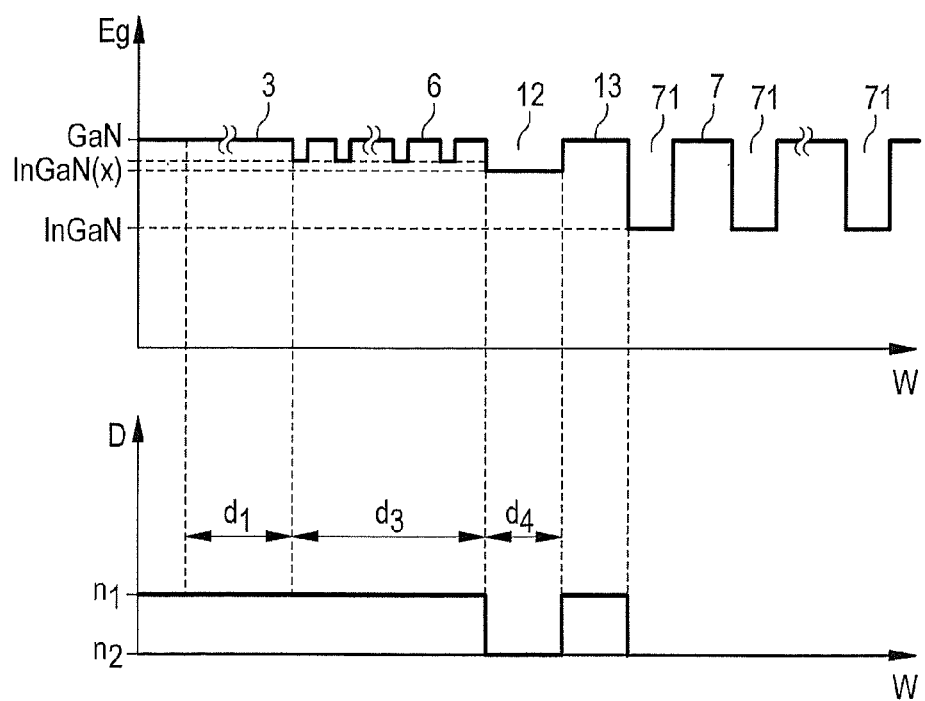
FIG. 4 shows the material composition and doping for an example of a semiconductor layer sequence.

With reference to the diagram in FIG. 4, a third variant for the material composition and doping of the protective layers and also of the injection layer and of the active zone of a radiation-emitting semiconductor chip of the type mentioned above is shown.

Elements that are identical, of identical type or act identically are provided with the same reference signs in the figures.

FIG. 1 shows an example of a radiation-emitting semiconductor chip 1 described here, in a schematic sectional illustration. The radiation-emitting semiconductor chip 1 comprises a substrate 10 and a semiconductor layer sequence 2 arranged on the substrate 10. The substrate 10 can contain sapphire or consist thereof. The semiconductor layer sequence 2 is preferably based on a nitride compound semiconductor material.

The semiconductor layer sequence 2 has an n-doped region 8 and a p-doped region 9, wherein a pn junction is formed between the n-doped region 8 and the p-doped region 9. Both the n-doped region 8 and the p-doped region 9 can comprise a plurality of semiconductor layers, wherein it is not necessary for each of the semiconductor layers to be doped.

Furthermore, the semiconductor layer sequence 2 comprises a first protective layer 3 and a second protective layer 5. The first protective layer 3 is arranged on the n-doped region 8 in a growth direction W. The second protective layer 5 is arranged on the first protective layer 3 in the growth direction W.

Furthermore, the semiconductor layer sequence 2 has an active zone 7 that generates radiation disposed downstream of the first and second protective layers 3, 5 in the growth direction W. An injection layer 6 is arranged between the active zone 7 and the second protective layer 5.

The radiation-emitting semiconductor chip 1 is pervaded by dislocations, for example, so-called "threading" dislocations 11. The latter occur in particular during the heteroepitaxy of the nitride compound semiconductor material on sapphire with high density. In this case, the threading dislocations 11 constitute potential paths for an ESD voltage pulse, the electrical charge of which is dissipated in the reverse direction of the pn junction.

The first protective layer 3 of the radiation-emitting semiconductor chip 1 is formed with crystal defects 4. In particular, the crystal defects 4 arise at the lines of the threading dislocations 11. In regions having crystal defects 4, the pn junction of the semiconductor layer sequence 2 leads to microdiodes, via which the leakage current paths formed by the threading dislocations 11 are encapsulated in the first protective layer 3. Preferably, at least 75%, particularly preferably all, of the threading dislocations 11 comprise a microdiode.

The second protective layer 5 of the radiation-emitting semiconductor chip 1 is arranged in particular directly on the first protective layer 3. The second protective layer 5 provides for homogenization of the current flow via the microdiodes.

In regions having crystal defects 4, the semiconductor layer sequence 2 has in particular a breakdown behavior of identical type, that is to say that, in particular, in these regions the semiconductor layer sequence 2 has the same or substantially the same breakdown voltage. In this case, the breakdown voltage of the pn junction in the regions having crystal defects 4 is less than the breakdown voltage in the regions without crystal defects. Therefore, the microdiodes open simultaneously in the event of an ESD voltage pulse in the reverse direction. During operation of the semiconductor chip 1, preferably an electrical resistance of the semiconductor layer sequence 2 in the reverse direction in regions having crystal defects 4 is reduced compared to regions without crystal defects. Therefore, the charge impressed by the ESD voltage pulse does not flow away via the weakest leakage path or paths along the dislocation lines 11, rather the charge is distributed among the ensemble of the microdiodes. Furthermore, the second protective layer 5 provides for a uniform charge distribution among the ensemble of the microdiodes. Therefore, a critical current density that leads to the destruction of the radiation-emitting semiconductor chip 1 is attained at none of the paths. A quasi-two-dimensional breakdown takes place over the entire cross-sectional area of the radiation-emitting semiconductor chip 1, such that an ESD strength of at least 1 kV, for example, of typically 2 kV, is achieved.

By virtue of the second protective layer 5 being introduced, a thickness d1 of the first protective layer 3 can be reduced. The thickness d1 of the first protective layer 3 assumes values of 20 nm to 100 nm, in particular 20 nm to 80 nm. The second protective layer 5 is made thinner than the first protective layer 3. By way of example, the thickness d2 of the second protective layer 5 can assume values of 2 nm to 15 nm.

Furthermore, the second protective layer 5 is a highly doped layer having an average n-type doping of $2*10^{18}/cm^3$ to $2*10^{19}/cm^3$ and a preferred average n-type doping of $6*10^{18}/cm^3$. By contrast, the first protective layer 3 has a lower average n-type doping, which is in particular 0 to $4*10^{18}/cm^3$, preferably $1.5*10^{18}/cm^3$.

The injection layer 6 arranged between the second protective layer 5 and the active zone 7 is provided to improve the injection of electrons into the active zone 7. Furthermore, the injection layer 6 advantageously brings about a material matching between the n-doped region 8 and the active zone 7, which in particular has a higher In proportion than the n-doped region 8. Preferably, the injection layer 6 comprises a succession of layers having different material compositions. In particular, the average In proportion in the injection layer 6 is greater than in the n-doped region 8 and less than in the active zone 7.

Furthermore, the average n-type doping of the injection layer 6 is less than the average n-type doping of the second protective layer 5. The average n-type doping of the injection layer 6 assumes, in particular, values of 0 to $4*10^{18}/cm^3$, preferably of the value $5*10^{17}/cm^3$.

In a departure from the example described, the semiconductor layer sequence can have a further protective layer (not explicitly illustrated in FIG. 1). The further protective layer can be provided as an alternative to the second protective layer or in addition to the second protective layer. This will be explained in greater detail in connection with FIG. 4.

Possible material compositions and dopings for the first and second protective layers 3, 5 and also the injection layer 6 and the active zone 7 are evident from the diagrams in FIGS. 2 and 3.

FIG. 2 shows the material composition and doping for a first variant of a semiconductor layer sequence of a radiation-emitting semiconductor chip.

The upper diagram in FIG. 2 shows the growth direction W of the semiconductor layer sequence in the abscissa direction. The energy Eg of the band gap for the various semiconductor layers 3, 5, 6, 7 of the semiconductor layer sequence is plotted on the ordinate axis. As can be seen, the first protective layer 3 consists of GaN. The second protective layer 5 is also formed from GaN. The injection layer 6 comprises a superlattice structure having a succession of GaN layers and InGaN layers, wherein an In proportion x1 of the InGaN layers is 0 to 0.12, preferably 0.06. The injection layer 6 can have in particular up to 20 periods of a succession of GaN layers and InGaN layers. The active zone 7 has a multiple quantum well structure formed from a succession of GaN layers and InGaN layers, wherein an In proportion of the InGaN layers is x2=0.3, for example. The active zone 7 can have in particular between 3 and 7 periods of a succession of GaN layers and InGaN layers.

In the lower diagram in FIG. 2, the n-type doping D of the various semiconductor layers 3, 5, 6, 7 of the semiconductor layer sequence is plotted against the growth direction W. Possible dopants are silicon or germanium. As is evident from the lower diagram, the first protective layer 3 has a constant doping n1, which is $1.5*10^{18}/cm^3$. The first protective layer 3 has a thickness d1=60 nm. Furthermore, the second protective layer 5 also has a constant doping n2, which is higher than the doping n1 and is $6*10^{18}/cm^3$. The thickness d2 of the second protective layer 5 is 5 nm in this case. The injection layer 6 likewise has a constant doping n3, which is lower than the dopings n1 and n2 of the first and second protective layers 3, 5. The injection layer 6 is d3=60 nm thick. The thickness d3 of the injection layer 6 corresponds to the distance between the second protective layer 5 and the active zone 7, which is therefore 60 nm.

FIG. 3 shows the material composition and doping for a second variant of a semiconductor layer sequence of a radiation-emitting semiconductor chip described here.

As is evident from the upper diagram in FIG. 3, the first protective layer 3 is formed from InGaN having an In proportion x1. The second protective layer 5 can be formed from GaN or InGaN. Furthermore, the injection layer 6 comprises a superlattice structure having a succession of GaN layers, which can likewise contain In, and InGaN layers, wherein the In proportion x2 of the InGaN layers is greater than the In proportion x1 of the first protective layer 3. The injection layer 6 can have in particular up to 20 periods of a succession of (In)GaN layers and InGaN layers. The active zone 7 has a multiple quantum well structure formed from a succession of (In)GaN layers and InGaN layers, wherein the In proportion of the InGaN layers is, for example, x3=0.3.

As is evident from the lower diagram in FIG. 3, the first protective layer 3 is modulation-doped. That is to say that the doping changes within the first protective layer 3. In a partial layer of the first protective layer 3 having the thickness d1a, the partial layer facing away from the second protective layer 5, the doping n1a is higher than in a partial layer having the thickness d1b, the latter partial layer facing the second protective layer 5. The dopings n2 and n3 of the second protective layer 5 and of the injection layer 6 can assume the same values such as have already been mentioned in connection with the lower diagram in FIG. 2. The same correspondingly applies to the thicknesses d1, d2 and d3.

The material composition and doping for a third variant of a semiconductor layer sequence as shown in FIG. 4 substantially correspond to the first variant described in connection with FIG. 2. In contrast thereto, the semiconductor layer sequence 2 has a further protective layer 12. The second protective layer is dispensed with in this example. In a departure from this, however, the further protective layer can also be provided in addition to the second protective layer. Therefore, the further protective layer 12 described below can in particular also be employed in the variants described with reference to FIGS. 2 and 3.

The further protective layer 12 is arranged between the first protective layer 3 and the active zone 7, in particular between the injection layer 6 and the active zone.

A separating layer 13 is arranged between the further protective layer 12 and a quantum layer 71—situated closest to the further protective layer—of the multiple quantum structure of the active zone 7.

The further protective layer 7 is doped with a doping concentration n2, the magnitude of which is at most half that of the doping concentration n1 with which the first protective layer 3 is doped. Preferably, the further protective layer is nominally undoped.

In the example shown, the first protective layer 3, the injection layer 6 and the separating layer 13 have the same doping concentration. However, the doping concentrations of these layers can also deviate from one another. Preferably, the magnitude of the doping concentration of the further protective layer is at most half that of the doping concentration of the layers directly adjoining on both sides of the further protective layer.

A thickness d4 of the further protective layer 12 is preferably 2 nm to 15 nm, particularly preferably 4 nm to 7 nm, for example, 5 nm. The further protective layer 12 is therefore significantly thinner than the first protective layer.

A thickness of the separating layer 13 is preferably 2 nm to 15 nm.

The further protective layer 12 contains $In_xGa_{1-x}N$ where $0 \leq x \leq 1$. The indium content x is preferably less than the indium content of the quantum layers 71 of the active zone 7. Furthermore, the indium content of the further protective layer is greater than the indium content of the first protective layer and greater than the maximum indium content of the injection layer 6.

In a departure from the example shown, the further protective layer 12 can also be arranged on that side of the first protective layer 3 facing away from the active zone 7.

It has been found that, as a result of the further protective layer that is undoped or at least weakly doped compared with the adjoining layers, the ESD strength can be improved, without the total thickness of the protective layers having to be significantly increased for this purpose.

Our chips and methods are not restricted by the description on the basis of the examples. Rather, this disclosure encompasses any novel feature and also any combination of features, which in particular includes any combination of features in the appended claims, even if the feature or -combination itself is not explicitly specified in the claims or examples.

The invention claimed is:

1. A radiation-emitting semiconductor chip having a semiconductor layer sequence based on a nitride compound semiconductor material and having a pn junction comprising:
    a first protective layer having deliberately introduced crystal defects,
    a second protective layer having a higher doping than the first protective layer, wherein the first protective layer protects the semiconductor chip against electrostatic discharge pulses,
    an active zone that generates radiation disposed downstream of the first protective layer in a growth direction, wherein
    during operation of the semiconductor chip, a breakdown behavior of the semiconductor layer sequence in a reverse direction in regions having crystal defects differs from regions without crystal defects, and wherein in the event of electrostatic discharge pulses, electrical charge is dissipated in a homogeneously distributed manner via the regions having crystal defects.

2. The radiation-emitting semiconductor chip according to claim 1, wherein the second protective layer is n-doped and an average doping is $2*10^{18}/cm^3$ to $2*10^{19}/cm^3$.

3. The radiation-emitting semiconductor chip according to claim 1, wherein the second protective layer has a thickness of 2 nm to 50 nm.

4. The radiation-emitting semiconductor chip according to claim 1, wherein the second protective layer is arranged at a distance of greater than zero from the active zone.

5. The radiation-emitting semiconductor chip according to claim 1, wherein the second protective layer is arranged between the first protective layer and the active zone.

6. The radiation-emitting semiconductor chip according to claim 1, wherein the semiconductor layer sequence has an injection layer arranged between the second protective layer and the active zone.

7. The radiation-emitting semiconductor chip according to claim 6, wherein the injection layer comprises a layer sequence of alternately arranged InGaN layers and GaN layers.

8. The radiation-emitting semiconductor chip according to claim 6, wherein the second protective layer has a higher doping than the injection layer.

9. The radiation-emitting semiconductor chip according to claim 1, wherein a material composition and/or the doping of at least one of three layers comprising the first protective layer, the second protective layer and the injection layer change(s) within the respective layer.

10. The radiation-emitting semiconductor chip according to claim 1, wherein the first protective layer has at least two partial layers, of which a partial layer facing the second protective layer has a lower doping than a partial layer facing away from the second protective layer.

11. The radiation-emitting semiconductor chip according to claim 1, wherein the first protective layer has a thickness of 20 nm to 100 nm.

12. The radiation-emitting semiconductor chip according to claim 1, wherein the crystal defects are V-defects and a large portion of the crystal defects have similar dimensions.

13. The radiation-emitting semiconductor chip according to claim 1, wherein during operation of the semiconductor chip, an electrical resistance of the semiconductor layer sequence in the reverse direction in regions having crystal defects is reduced compared to regions without crystal defects.

14. The radiation-emitting semiconductor chip according to claim 1, wherein the pn junction of the semiconductor layer sequence has a higher threshold voltage in a forward direction in the regions having crystal defects than in regions without crystal defects.

15. The radiation-emitting semiconductor chip according to claim 1, wherein the density of the crystal defects is at least $5*10^{7}/cm^2$.

16. The radiation-emitting semiconductor chip according to claim 1, wherein the semiconductor layer sequence has a further protective layer, and the further protective layer has a lower doping than the first protective layer.

17. The radiation-emitting semiconductor chip according to claim 16, wherein the further protective layer is undoped.

18. The radiation-emitting semiconductor chip according to claim 16, wherein the further protective layer is arranged between the first protective layer and the active zone.

19. The radiation-emitting semiconductor chip according to claim 16, wherein the further protective layer has a thickness of 2 nm to 15 nm.

20. A radiation-emitting semiconductor chip having a semiconductor layer sequence based on a nitride compound semiconductor material and having a pn junction comprising:
a first protective layer having deliberately introduced crystal defects,
a second protective layer having a higher doping than the first protective layer, wherein the first protective layer protects the semiconductor chip against electrostatic discharge pulses,
an active zone that generates radiation disposed downstream of the first protective layer in the growth direction, wherein
during operation of the semiconductor chip, an electrical resistance of the semiconductor layer sequence in a reverse direction in regions having crystal defects is reduced compared to regions without crystal defects, and the second protective layer homogenizes current flow due to its higher doping so that in the event of electrostatic discharge pulses electrical charge is dissipated in a homogeneously distributed manner via the regions having crystal defects.

* * * * *